(12) United States Patent  
Hsu et al.

(10) Patent No.: US 7,671,704 B2
(45) Date of Patent: Mar. 2, 2010

(54) LC RESONANT CIRCUIT

(75) Inventors: Chia-Jen Hsu, Taipei (TW); Chuan-Jane Chao, Taipei (TW)

(73) Assignee: Richwave Technology Corp., Taipei (TW)

(*) Notice: Subject to any disclaimer, the term of this patent is extended or adjusted under 35 U.S.C. 154(b) by 33 days.

(21) Appl. No.: 11/819,281

(22) Filed: Jun. 26, 2007

(65) Prior Publication Data

US 2008/0169883 A1    Jul. 17, 2008

(30) Foreign Application Priority Data

Jun. 28, 2006  (TW)  ............... 95123315 A (51) Int. Cl.
*H03H 7/01*    (2006.01)
(52) U.S. Cl. .................................... 333/185
(58) Field of Classification Search ........... 333/185, 333/172
See application file for complete search history.

(56) References Cited

U.S. PATENT DOCUMENTS

| | | | |
|---|---|---|---|
| 5,173,671 A | 12/1992 | Wendler et al. | |
| 6,734,760 B2* | 5/2004 | Tsujiguchi | 333/172 |
| 6,842,080 B1 | 1/2005 | Okamoto et al. | |
| 7,268,645 B2* | 9/2007 | Meltzer et al. | 333/175 |
| 2005/0134405 A1* | 6/2005 | Ochi et al. | 333/185 |
| 2007/0069835 A1* | 3/2007 | Kamgaing | 333/185 |

FOREIGN PATENT DOCUMENTS

CN    1364334 A    8/2002

* cited by examiner

*Primary Examiner*—Benny Lee
*Assistant Examiner*—Alan Wong
(74) *Attorney, Agent, or Firm*—Muncy, Geissler, Olds & Lowe, PLLC (57) ABSTRACT

An LC resonant circuit. The LC resonant circuit comprises an inductor and a conductor. The inductor is an electrode plate of a capacitor. The conductor is over, under, or on both sides of the inductor and used as the other electrode plate of the capacitor.

12 Claims, 9 Drawing Sheets

LC RESONANT CIRCUIT

BACKGROUND OF THE INVENTION

1. Field of the Invention

The invention relates to resonant circuits and, in particular, to LC resonant circuits.

2. Description of the Related Art

Figure 1A:
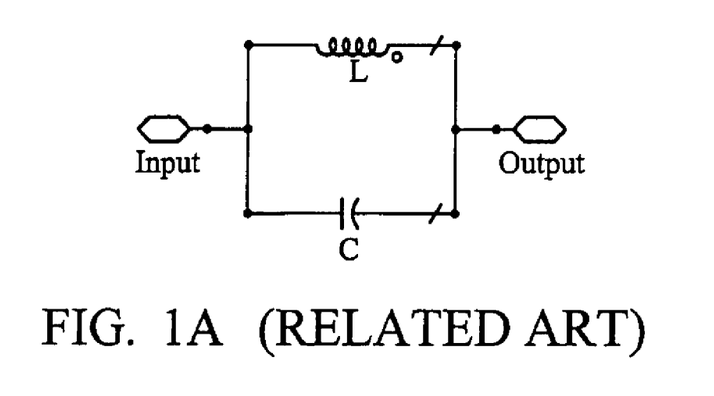
FIGS. 1A and 1B are respectively circuit diagrams of traditional LC resonant circuits connected in parallel and in series.
Figure 1B:
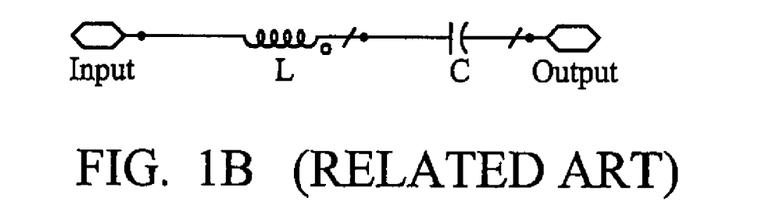

In circuit design, to accomplish signal transmission, an inductor and a capacitor connected in parallel are often used in an LC resonant circuit, as shown in FIG. 1A. To filter signal, an inductor and a capacitor connected in series are often used in an LC resonant circuit, as shown in FIG. 1B.

Figure 2:
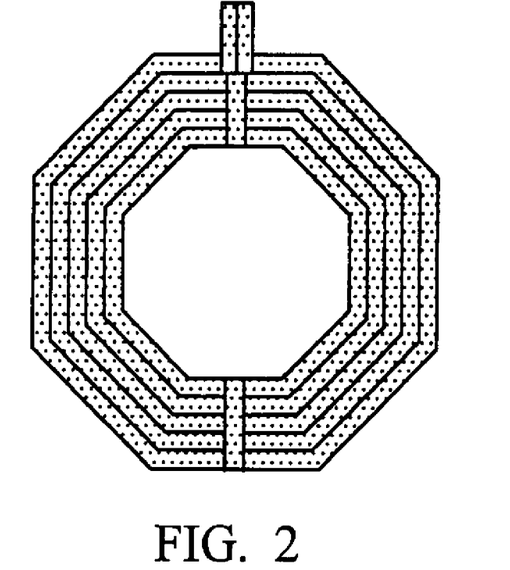
FIG. 2 is a schematic diagram of an inductor in an LC resonant circuit according to an embodiment of the invention and in a traditional LC resonant circuit.

An LC resonant circuit is often formed with an independent inductor and an independent capacitor, connected either in series or in parallel, on a substrate. The independent inductor can be a plane inductor, a spiral inductor, or the like and a schematic diagram thereof is shown in FIG. 2. The independent capacitor can be an MIM (metal-insulator-metal) capacitor, a POP (poly-on-poly) capacitor, or the like. The inductor and the capacitor are independent; that means, they do not overlap each other in layout. The substrate can be PCB substrate, LTCC substrate, GaAs substrate, silicon substrate, SOI substrate, or the like. If such LC resonant circuit is formed on an insulating substrate, excellent signal transmission and filtering can be obtained due to electrical insulation of the insulating substrate. However, a substrate in a typical semiconductor process is semi-conductive. As a result, energy of a high frequency signal is lost due to signal loss via the semi-conductive substrate. Accordingly, LC resonant circuit designed by traditional methods cannot result in satisfied signal transmission and filtering.

BRIEF SUMMARY OF THE INVENTION

An embodiment of an LC resonant circuit comprises an inductor and a conductor. The inductor is an electrode plate of a capacitor. The conductor is over, under, or on both sides of the inductor and used as the other electrode plate of the capacitor.

An embodiment of an LC resonant circuit comprises an inductor, a dielectric layer, and a conductor. The inductor is disposed above a substrate. The dielectric layer is disposed over the inductor. The conductor is over the dielectric layer and layout thereof overlaps part of the inductor.

An embodiment of an LC resonant circuit comprises an inductor, a dielectric layer, and a conductor. The conductor is disposed above a substrate. The dielectric layer is disposed over the conductor. The inductor is over the dielectric layer and layout thereof overlaps part of the conductor.

An embodiment of an LC resonant circuit comprises a first inductor, a first dielectric layer, a first conductor, a second dielectric layer, and a second conductor. The first conductor is disposed above a substrate. The first dielectric layer is disposed over the first conductor. The inductor is disposed over the first dielectric layer and layout thereof overlaps part of the first conductor. The second dielectric layer is disposed over the inductor. The second conductor is over the second dielectric layer and layout thereof overlaps part of the inductor.

According to embodiments of the invention, a conductor is inserted over, under, or on both sides of an inductor. The conductor may be hollowed out in part to minimize magnetic field impact of the inductor. The inserted conductor and the inductor form a capacitor. The capacitor and the inductor, connected either in series or in parallel, form an LC resonant circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
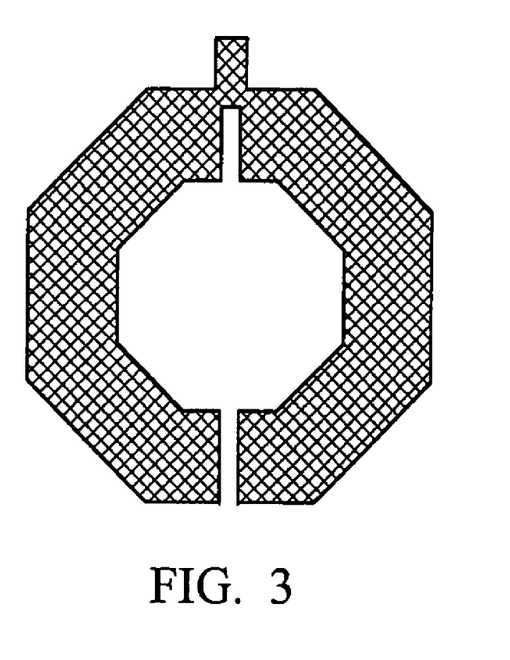
FIG. 3 is a schematic diagram of an inserted conductor in an LC resonant circuit according to an embodiment of the invention.

To accomplish good signal transmission and filtering, LC resonant circuits can be designed according to embodiments of the invention. Firstly, an inductor is designed. The inductor can be a plane inductor, spiral inductor, or the like and a schematic diagram thereof is shown in FIG. 2 wherein the inductor can be consisted with single layer or plural layers. The inductor is used as an electrode plate of a capacitor. Then, a conductor is provided as shown in FIG. 3. The conductor is disposed over, under, or on both sides of the inductor and used as another electrode plate of the capacitor. The conductor and the inductor generate an equivalent capacitor. Preferably, the conductor is partially hollowed out such that magnetic field impact of the inductor is minimized and overall performance of the inductor and the LC resonant circuit is thus improved. Furthermore, the inductor and the conductor should be integrated appropriately. Since the inductor and the conductor are respectively electrode plates of the capacitor, when a terminal of the inductor and the conductor are connected, an LC resonant circuit connected in parallel is formed between two terminals of the inductor, as shown in FIG. 1A. To the contrary, when the inductor and the conductor are not connected, an LC resonant circuit connected in series is formed between a terminal of the inductor and the conductor.

Figure 4A:
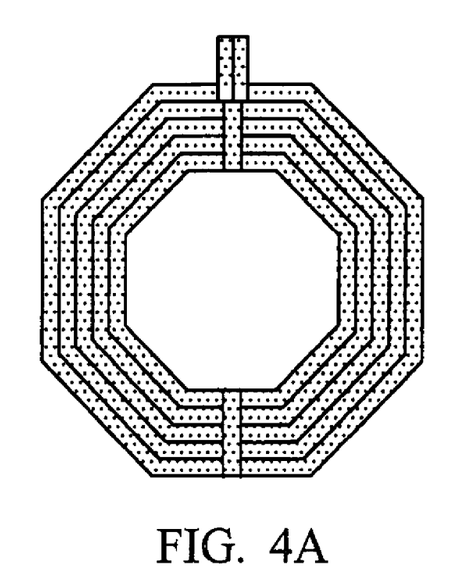
FIGS. 4A and 4B are respectively a top view and a cross section view of an LC resonant circuit according to an embodiment of the invention.
Figure 4B:
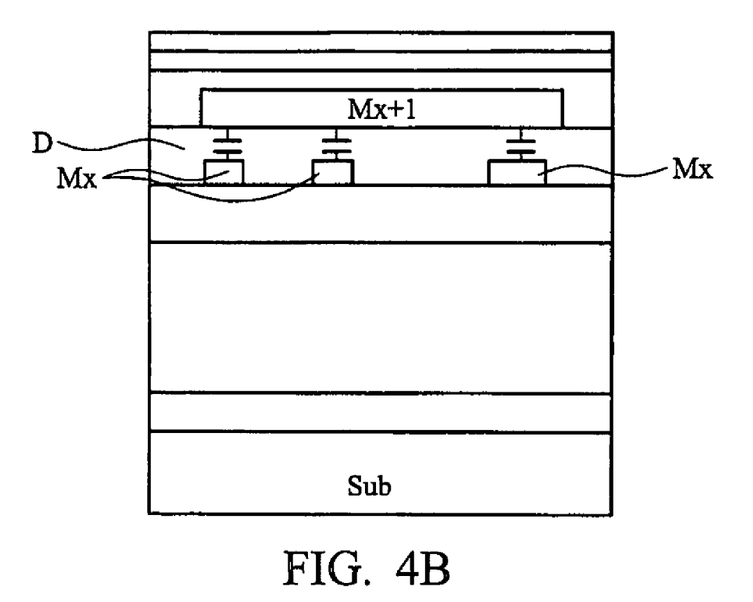

FIGS. 4A and 4B are respectively a top view and a cross section view of an LC resonant circuit according to an embodiment of the invention. The LC resonant circuit comprises an inductor layer $M_x$, a dielectric layer D and a conductor $M_{x+1}$. The conductor $M_{x+1}$ is disposed over the dielectric layer D and layout thereof overlaps part of the inductor layer $M_x$. Preferably, layout and shape of the conductor $M_{x+1}$ is substantially the same as the inductor layer $M_x$ such that larger equivalent capacitance is generated. In addition, the conductor $M_{x+1}$ is preferably partially hollowed out such that magnetic field impact of the inductor is minimized and overall performance of the inductor itself and the LC resonant circuit is thus improved. As previously disclosed, LC resonant circuits connected either in parallel or in series can be designed via connection or disconnection of the conductor layer and the inductor layer.

Figure 5A:
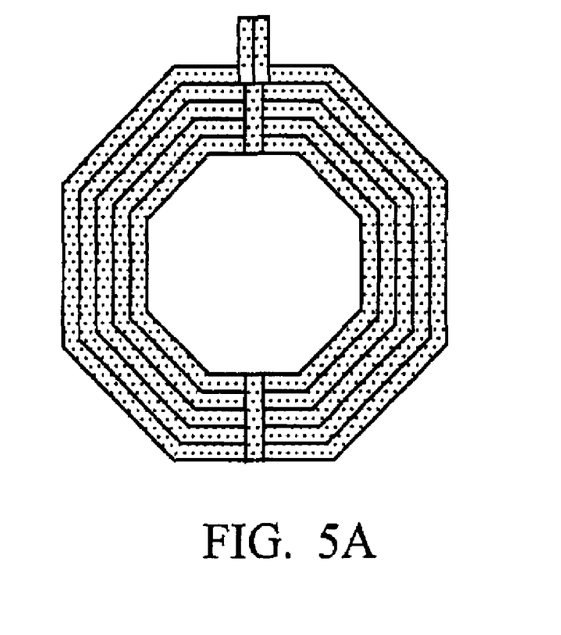
FIGS. 5A and 5B are respectively a top view and a cross section view of an LC resonant circuit according to another embodiment of the invention.
Figure 5B:
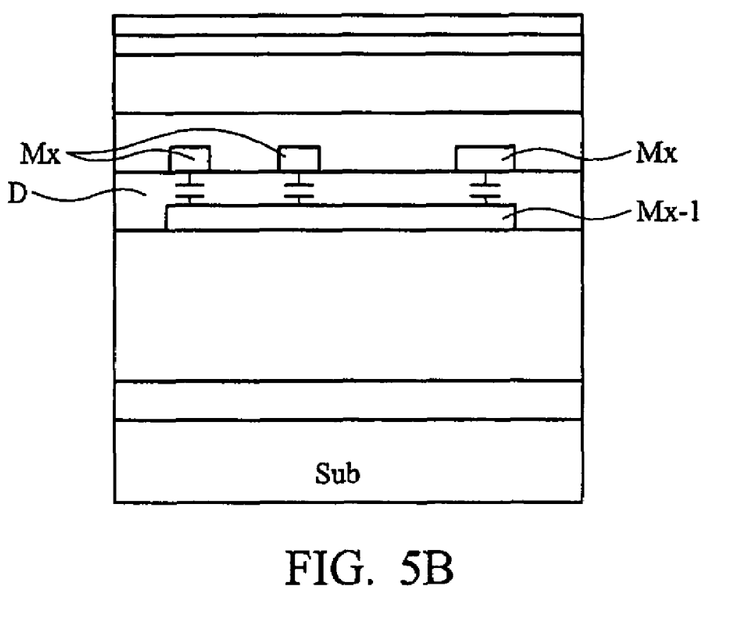

FIGS. 5A and 5B are respectively a top view and a cross section view of an LC resonant circuit according to another embodiment of the invention. The LC resonant circuit comprises a conductor $M_{x-1}$, a dielectric layer D and an inductor layer $M_x$. The conductor $M_{x-1}$ is disposed over a substrate Sub, the dielectric layer D over the conductor $M_{x-1}$ and the inductor layer $M_x$ over the dielectric layer D. The layout of the inductor layer $M_x$ overlaps part of the conductor $M_{x-1}$. Preferably, layout and shape of the conductor $M_{x-1}$ is substantially the same as the inductor layer $M_x$ such that larger equivalent capacitance is generated. In addition, the conductor $M_{x-1}$ is preferably partially hollowed out such that magnetic field impact of the inductor is minimized and overall performance of the inductor itself and the LC resonant circuit is thus improved. As previously disclosed, LC resonant circuits connected either in parallel or in series can be designed via connection or disconnection of the conductor layer and the inductor layer.

Figure 6A:
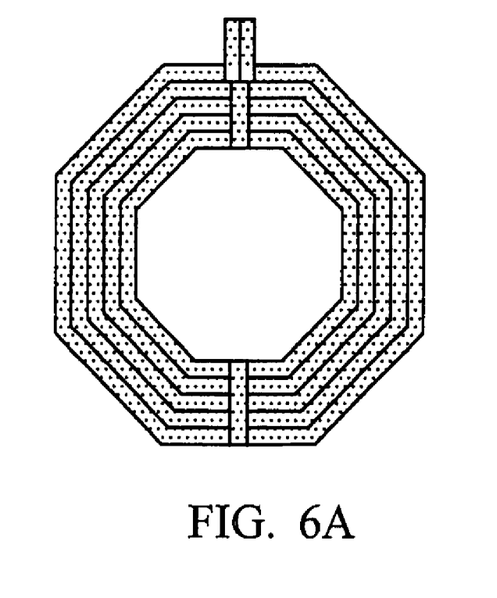
FIGS. 6A and 6B are respectively a top view and a cross section view of an LC resonant circuit according to yet another embodiment of the invention.
Figure 6B:
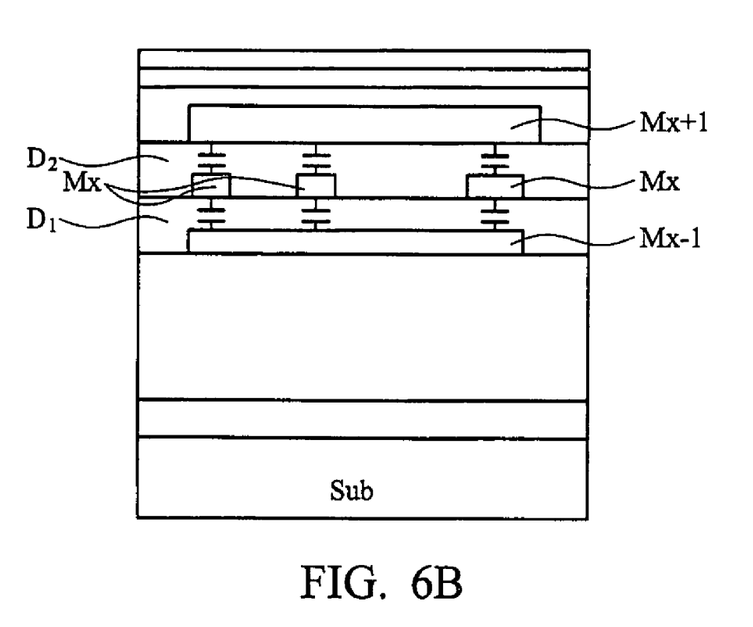

FIGS. 6A and 6B are respectively a top view and a cross section view of an LC resonant circuit according to yet another embodiment of the invention. The LC resonant circuit comprises a first conductor $M_{x-1}$, a first dielectric layer $D_1$, an inductor layer $M_x$, a second dielectric layer $D_2$, and a second conductor $M_{x+1}$. The first conductor $M_{x-1}$ is disposed over a substrate Sub, the first dielectric layer $D_1$ over the first conductor $M_{x-1}$ the inductor layer $M_x$ over the first dielectric layer $D_1$. The layout of the inductor layer $M_x$ overlaps part of the conductor $M_{x-1}$. The second dielectric layer $D_2$ is disposed over the inductor layer $M_x$, and the second conductor $M_{x+1}$ over the second dielectric layer $D_2$. The layout of the second conductor $M_{x+1}$ overlaps part of the inductor layer $M_x$. Preferably, layout and shape of the first conductor $M_{x-1}$ and the second conductor $M_{x+1}$ are substantially the same as the inductor layer $M_x$ such that larger equivalent capacitance is generated. In addition, the first conductor $M_{x-1}$ and the second conductor $M_{x+1}$ are preferably partially hollowed out such that magnetic field impact of the inductor is minimized and overall performance of the inductor itself and the LC resonant circuit is thus improved. As previously disclosed, LC resonant circuits connected either in parallel or in series can be designed via connection or disconnection of the conductor layers and the inductor layer.

Figure 7A:
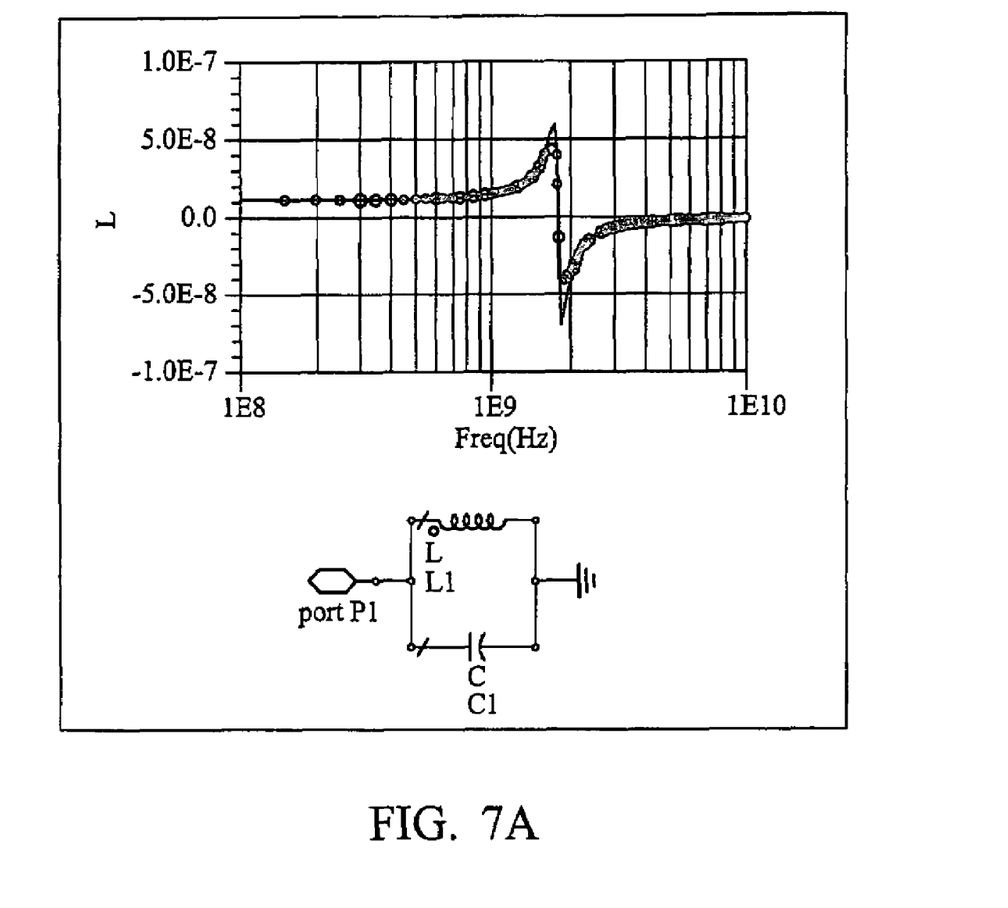
FIG. 7A is a schematic diagram showing inductance characteristics of an LC resonant circuit according to an embodiment of the invention and a traditional LC resonant circuit.
Figure 7B:
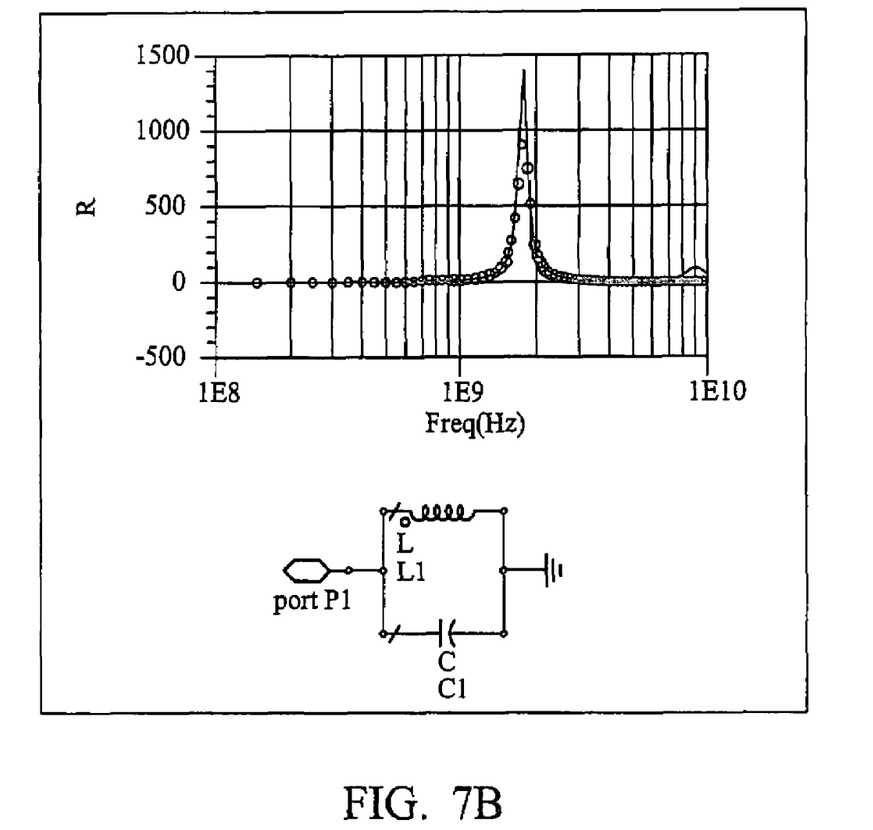
FIG. 7B is a schematic diagram showing resistance characteristics of an LC resonant circuit according to an embodiment of the invention and a traditional LC resonant circuit.
Figure 7C:
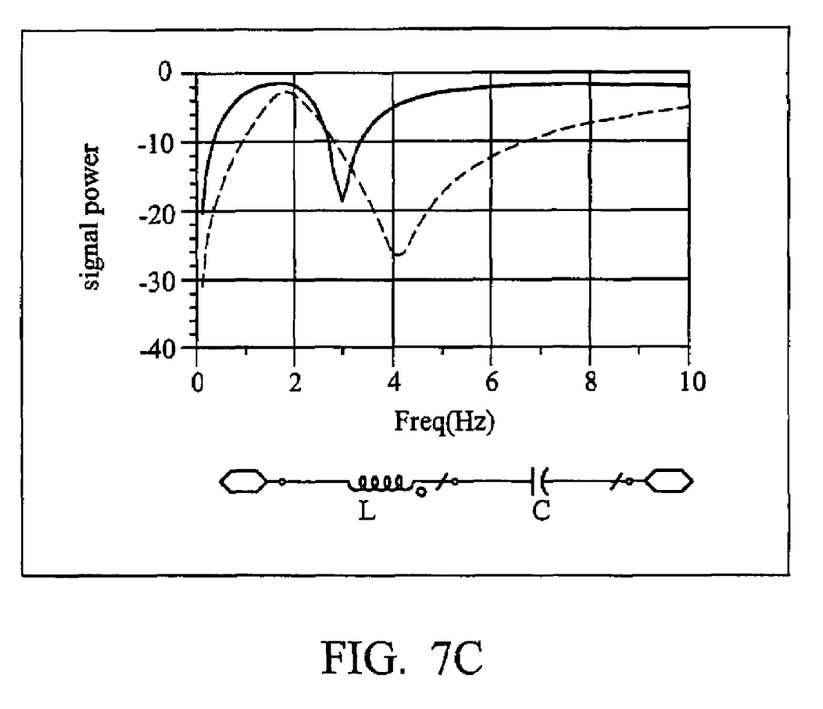
FIG. 7C is a schematic diagram showing characteristics of signal power transmission in an LC resonant circuit according to an embodiment of the invention and a traditional LC resonant circuit.

LC resonant circuits connected either in series or in parallel are obtained according to embodiments of the invention. Resonant frequencies of the LC resonant circuits can be adjusted by changing area, layout and location of the inserted conductor. LC resonant circuits according to an embodiment of the invention are electrically verified and compared with traditional LC resonant circuits in a 6M (six-metal) silicon process. The traditional LC resonant circuits are formed with spiral inductors and MIM (metal-insulator-metal) capacitors. The LC resonant circuits according to an embodiment of the invention are formed by inserting metal conductors under spiral inductors such that equivalent capacitors are generated; then the LC resonant circuits are formed with the inductors and the equivalent capacitors that consumes less area than the traditional one. FIG. 7A and FIG. 7B are schematic diagrams showing inductance and resistance characteristics, respectively, of the LC resonant circuit according to an embodiment of the invention and the traditional LC resonant circuit those are parallel configuration. The solid curve in FIG. 7A represents inductance characteristics of the LC resonant circuit according to an embodiment of the invention and the circles represent inductance characteristics of the traditional LC resonant circuit. There is no significant difference between the inductance characteristics. In FIG. 7B, the solid curve represents resistance characteristics of the LC resonant circuit according to an embodiment of the invention and the circles represent resistance characteristics of the traditional LC resonant circuit. According to FIG. 7B, it is shown that resonant resistance (about 1420 Ω) of the LC resonant circuit connected in parallel according to an embodiment of the invention is much higher than that (about 950 Ω) of the traditional one. Higher resonant impedance improves signal transmission and filtering. For circuits with series configuration, FIG. 7C is a schematic diagram showing characteristics of signal power transmission in the LC resonant circuit according to an embodiment of the invention and the traditional LC resonant circuit. The solid curve in FIG. 7C represents characteristics of signal power transmission in the LC resonant circuit according to an embodiment of the invention and the dashed curve represents characteristics of signal power transmission in the traditional LC resonant circuit. According to FIG. 7C, it is shown that bandwidth of signal power transmission in the LC resonant circuit connected in series according to an embodiment of the invention is much wider than that of the traditional one and thus meets bandwidth requirements of wide band transmission easier. In addition, power loss of the LC resonant circuit connected in series according to an embodiment of the invention is also less as little signal distortion is resulted.

Figure 8:
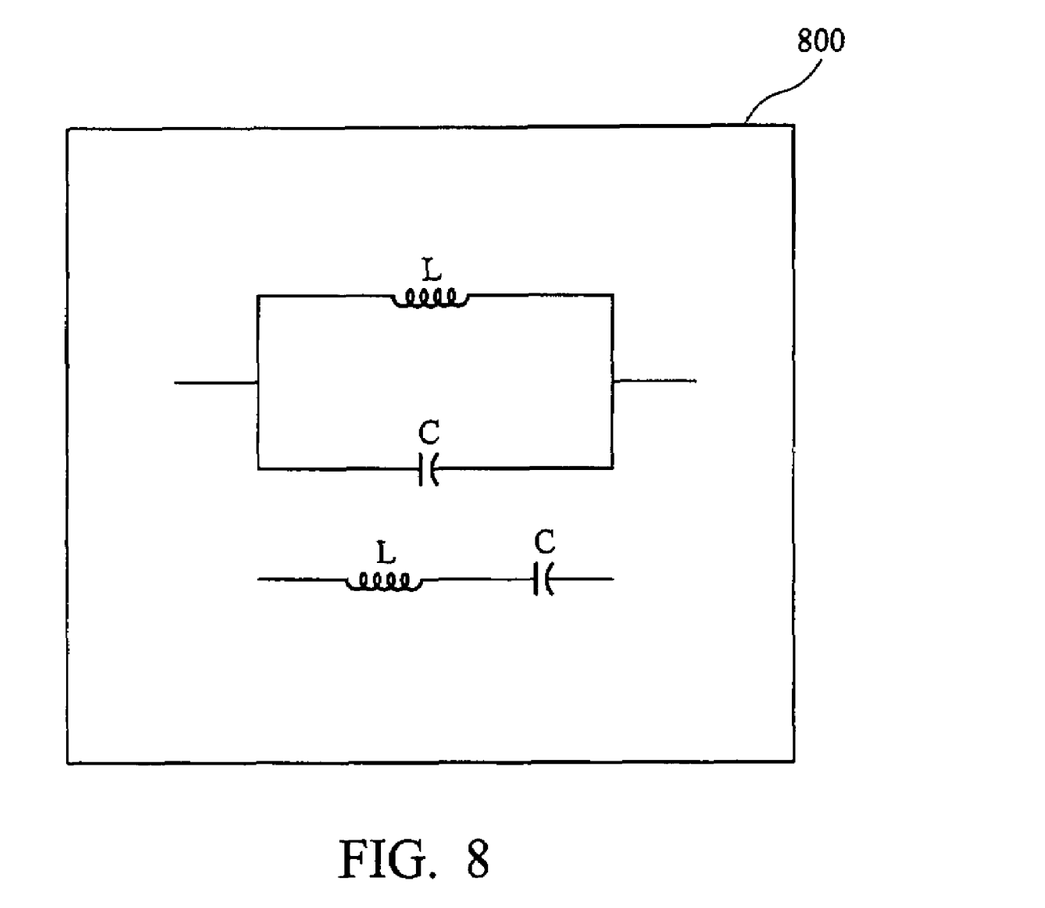
FIG. 8 is a schematic diagram of integrated circuits according to embodiments of the invention.

FIG. 8 is a schematic diagram of integrated circuits according to embodiments of the invention. The integrated circuits comprise LC resonant circuits disclosed in the invention.

According to embodiments of the invention, a conductor is inserted over, under, or on both sides of an inductor. The conductor may be hollowed out in part to minimize magnetic field impact of the inductor. The inserted conductor and the inductor form a capacitor. The capacitor and the inductor, connected either in series or in parallel, form an LC resonant circuit.

While the invention has been described by way of examples and in terms of preferred embodiment, it is to be understood that the invention is not limited thereto. Alternatively, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An LC resonant circuit, comprising:
  an inductor as one electrode plate of a capacitor; and
  a conductor disposed over, under, or on both sides of the inductor and used as the other electrode plate of the capacitor;

wherein layout and shape of the conductor is substantially the same as the inductor such that layout of the conductor overlaps the inductor;

wherein the conductor and the inductor are disconnected such that the LC resonant circuit between a terminal of the inductor and the conductor is one connected in series.

2. The LC resonant circuit as claimed in claim 1, wherein the conductor is partially hollowed out.

3. An integrated circuit comprising the LC resonant circuit as claimed in claim 1.

4. An LC resonant circuit, comprising:
an inductor as an electrode plate of a capacitor;
a dielectric layer disposed over the inductor; and
a conductor disposed over the dielectric, layer, wherein layout and shape of the conductor is substantially the same as the inductor such that layout of the conductor overlaps the inductor;
the conductor and the inductor are disconnected such that the LC resonant circuit between a terminal of the inductor and the conductor is one connected in series.

5. The LC resonant circuit as claimed in claim 4, wherein the conductor is partially hollowed out.

6. An integrated circuit comprising the LC resonant circuit as claimed in claim 4.

7. An LC resonant circuit, comprising:
a conductor over a substrate;
a dielectric layer disposed over the conductor; and
an inductor disposed over the dielectric layer, wherein layout and shape of the conductor is substantially the same as the inductor such that layout of the conductor overlaps the conductor;

wherein the conductor and the inductor are disconnected such that the LC resonant circuit between a terminal of the inductor and the conductor is one connected in series.

8. The LC resonant circuit as claimed in claim 7, wherein the conductor is partially hollowed out.

9. An integrated circuit comprising the LC resonant circuit as claimed in claim 7.

10. An LC resonant circuit, comprising:
a first conductor over a substrate;
a first dielectric layer disposed over the first conductor;
an inductor disposed over the first dielectric layer;
a second dielectric layer disposed over the inductor; and
a second conductor disposed over the second dielectric layer,
wherein layout and shape of the first and second conductors is substantially the same as the inductor such that layout of the inductor overlaps the first conductor and layout of the second conductor overlaps the inductor;
wherein the conductors and the inductor are disconnected such that the LC resonant circuit between a terminal of the inductor and the conductors is one connected in series.

11. The LC resonant circuit as claimed in claim 10, wherein the first and second conductors are partially hollowed out.

12. An integrated circuit comprising the LC resonant circuit as claimed in claim 10.

* * * * *